United States Patent [19]

Notani et al.

[11] Patent Number: 5,321,399
[45] Date of Patent: Jun. 14, 1994

[54] PARALLEL/SERIAL CONVERSION CIRCUIT, SERIAL/PARALLEL CONVERSION CIRCUIT AND SYSTEM INCLUDING SUCH CIRCUITS

[75] Inventors: Hiromi Notani; Harufusa Kondoh, both of Hyogo, Japan

[73] Assignee: Mitsubishi Denki Kabushiki Kaisha, Tokyo, Japan

[21] Appl. No.: 989,855

[22] Filed: Dec. 14, 1992

[30] Foreign Application Priority Data

May 18, 1992 [JP] Japan .................. 4-124890

[51] Int. Cl.$^5$ ........................... H03M 9/00
[52] U.S. Cl. .................... 341/100; 341/101; 307/272.2; 307/452; 377/81
[58] Field of Search ............. 307/452, 272.2; 377/72, 377/74, 78, 79, 81; 341/100, 101

[56] References Cited

U.S. PATENT DOCUMENTS

| | | | |
|---|---|---|---|
| 4,418,418 | 11/1983 | Aoki | 377/74 |
| 4,775,990 | 10/1988 | Kamuro et al. | 341/100 |
| 4,799,040 | 1/1989 | Yanagi | 341/101 |
| 5,132,993 | 7/1992 | Nishiura et al. | 377/81 |
| 5,264,738 | 11/1993 | Veendrick et al. | 307/272.2 |

FOREIGN PATENT DOCUMENTS 54-143031  11/1979  Japan .................. 377/74
3-37898    2/1991   Japan .

OTHER PUBLICATIONS

"Introduction to nMOS and CMOS VLSI Systems Design", by Amar Mukherjee, pp. 213-217.
Suzuki et al.; Clocked CMOS Calculator Circuitry; IEEE Journal of Solid State Circuits, vol. SC-8, No. 6; Dec. 1973, pp. 462-469.

Primary Examiner—Howard L. Williams
Attorney, Agent, or Firm—Lowe, Price, LeBlanc & Becker

[57] ABSTRACT

A ratio latch included in each slave latch is formed of a tri-state inverter and a weak inverter. During a period when a parallel input signal is supplied to the ratio latch in each master latch in response to a trigger clock signal, the tri-state inverter attains a high impedance state in response to an inverted trigger clock signal.

9 Claims, 13 Drawing Sheets

PARALLEL/SERIAL CONVERSION CIRCUIT, SERIAL/PARALLEL CONVERSION CIRCUIT AND SYSTEM INCLUDING SUCH CIRCUITS

BACKGROUND OF THE INVENTION

1. Field of the Invention

The present invention relates to parallel/serial conversion circuits, serial/parallel conversion circuits and systems including such circuits.

2. Description of the Background Art

Parallel/serial conversion circuits and serial/parallel conversion circuits are widely used for ICs (Integrated Circuits) for communication, ICs incorporating memories such as RAM (Random Access Memory), ROM (Read Only Memory) or the like, and other various circuits.

FIG. 8 is a diagram showing an example of construction of a conventional parallel/serial conversion circuit. The parallel/serial conversion circuit 10a shown in FIG. 8 includes n register circuits 11 connected in serial. n represents a positive integer herein. The register circuits 11 each include a master latch 12 and a slave latch 13.

There are provided n parallel input terminals correspondingly to the n register circuits 11. The master latch 12 in each register circuit 11 is connected to a corresponding parallel input terminal 16. The slave latch 13 in the register circuit 11 of the final stage is connected to a serial output terminal 14.

Each master latch 12 includes a switch S11, a parallel input switch S13, an inverter G11 and a weak inverter G12. The switch S11 is connected between a node n11 connected to the slave latch 13 of the preceding stage and a node n12. The switch S13 is connected between a corresponding parallel input terminal 16 and the node n12. The inverter G11 is connected between the node 12 and a node n13, while the weak inverter G12 is connected to the inverter G11 in antiparallel between the node n13 and the node n12.

The ratio of the gate width to the gate length of a transistor constituting the weak inverter G12 is set to be about 1/5 the ratio of the gate width to the gate length of a transistor constituting the inverter G11. Thus, the weak inverter G12 will have a current driving capability about 1/5 that of the inverter G11. The inverter G11 and the weak inverter G12 form a ratio latch L11.

Each slave latch 13 includes a switch S12, an inverter G13, and a weak inverter G14. The switch S12 is connected between the node n13 and a node n14. The inverter G13 is connected between the node n14 and a node n15, while the weak inverter G14 is connected to the inverter G13 in antiparallel between the node n15 and the node n14.

The weak inverter G14, as is the case with the weak inverter G12, has a current driving capability about 1/5 that of the inverter G13. The inverter G13 and the weak inverter G14 form a ratio latch L12.

The switch S11 in each master latch 12 is controlled by a control signal S1 output from an AND gate G10. One input terminal of the AND gate G10 is provided with a first clock signal CLK1, while the other input terminal is provided with a trigger clock signal /TRG. The switch S13 in each master latch 12 is controlled by a trigger clock signal TRG. Further, the switch S12 in each slave latch 13 is controlled by a second clock signal CLK2.

The first and second clock signals CLK1, CLK2 may be clock signals of two phases, or clock signals of a single phase. The trigger clock signal /TRG is an inverted signal of the trigger clock signal TRG.

Parallel input signals DI (0)–DI (n−1) are provided correspondingly to the parallel input terminals 16. A serial signal is output from the serial output terminal 14.

Now, a description of an operation of the parallel/serial conversion circuit shown in FIG. 8 follows in conjunction with a timing chart in FIG. 9.

In a cycle CY1, when the first clock signal CLK1 and the trigger clock signal TRG are pulled to "H", the switch S13 in each master latch 12 is turned on. Thus, the parallel input signal DI (m) is taken up and latched by the ratio latch L11.

When the second clock signal CLK2 rises to "H", the switch S12 in each slave latch 13 is turned on. Thus, the signal latched in the ratio latch L11 in each mater latch 12 is provided to the ratio latch L12 and latched.

In a cycle CY2, the first clock signal CLK1 rises to "H", and the trigger clock signal TRG remains to be "L". This causes the control signal S1 to rise to "H". Therefore, the switch S11 in each master latch 12 is turned on. Thus, the signal latched in the slave latch 13 of the preceding stage is applied to the ratio latch L11 and latched therein.

Then, when the clock signal CLK2 rises to "H", the switch 12 in each slave latch 13 is turned on. This causes the signal latched in the ratio latch L11 in each master latch 12 applied to the ratio latch L12 in each slave latch 13 and latched therein.

In cycles CY3–CYn, the same operation as the cycle CY2 is conducted.

As described above, the parallel input signals DI (0)–DI (n−1) input in response to the trigger clock signal TRG are shifted within a plurality of register circuits 11 in response to the first and second clock signals CLK1, CLK2, and sequentially output as the serial signal from the serial output terminal 14.

FIG. 11 is a diagram showing one example of a construction of a conventional serial/parallel conversion circuit The serial/parallel conversion circuit 20a shown in FIG. 11 includes n register circuits 21 connected in serial. Each register circuit 21 includes a master latch 22, a slave latch 23, and a parallel output latch 24. The master latch 22 and the slave latch 23 are connected in serial, and the parallel output latch 24 is connected to the connection point of the master latch 22 and the slave latch 23.

The serial/parallel conversion circuit 20a has n parallel output terminals 27 for outputting n parallel output signals DO (0)–DO (n−1). The parallel output latch 24 in each register circuit 21 is connected to a corresponding parallel output terminal 27. The master latch 22 in the register circuit 21 in the first stage is connected to the serial input terminal 25.

Each master latch 22 includes a switch S21, an inverter G21, and a weak inverter G22. The switch 21 is connected between a node n21 connected to the slave latch 23 of the preceding stage and a node n22. The inverter G21 is connected between the node n22 and a node n23, while the weak inverter G22 is connected in antiparallel to the inverter G21 between the node n23 and the node n22.

The weak inverter G22 has a current driving capability about 1/5 that of the inverter G21. The inverter G21 and the weak inverter G22 constitute a ratio latch L21.

Each slave latch 23 includes a switch S22, an inverter G23, and a weak inverter G24. The switch S22 is connected between the node n23 and a node n24. The inverter G23 is connected between the node n24 and a node n25, while the weak inverter G24 is connected to the inverter G23 in antiparallel between the node n25 and the node n24.

The weak inverter G24, as is the case with the weak inverter G22, has a current driving capability about 1/5 that of the inverter G23. The inverter G23 and the weak inverter G24 constitute a ratio latch L22.

Each parallel output latch 24 includes a parallel output switch S23, an inverter G25, and a weak inverter G26. The switch S23 is connected between the node n23 and a node n26. The inverter G25 is connected between the node n26 and a node n27, while the weak inverter G26 is connected in antiparallel to the inverter G25 between the node n27 and the node n26.

The weak inverter G26, as is the case with the weak inverter G22, has a current driving capability about 1/5 that of the inverter G25. The inverter G25 and the weak inverter G26 constitute a ratio latch L23.

The switch S21 in each master latch 22 is controlled by a first clock signal CLK1. The switch S22 in each slave latch 23 is controlled by a control signal S2 output from an AND gate G20. One input terminal of the AND gate G20 is provided with a second clock signal CLK2, and the other input terminal is provided with a trigger clock signal /TRG. The switch S23 in each parallel output latch 24 is controlled by a trigger clock signal TRG.

Now a description of an operation of the serial/parallel conversion circuit 20a in FIG. 11 follows in conjunction with a timing chart in FIG. 12.

In a cycle CY1, when the first clock signal CLK1 rises to "H", the switch S21 in each master latch 22 is turned on. Thus, the signal latched in the slave latch 23 of the preceding stage is provided to the ratio latch L21 in the master latch 22 and latched.

Then, when the second clock signal CLK2 rises to "H", the control signal S2 also rises to "H". Thus, the switch S22 in each slave latch 23 is turned on. Consequently, the signal latched in the ratio latch L21 in each master latch 22 is provided to the ratio latch L22 in each slave latch 23 and latched.

In cycles CY2-CYn−1, the same operation as the cycle CY1 is conducted.

In a cycle CYn, when the first clock signal CLK1 rises to "H", the switch S21 in each master latch 22 is turned on. Thus, the signal latched in the slave latch 23 of the preceding stage is provided to the ratio latch L21 in each master latch 22 and latched.

Then, when the second clock signal CLK2 and the trigger clock signal TRG rise to "H", the control signal S2 output from the AND gate G20 remains to be "L" without any change. Therefore, the switch S22 in each slave latch 23 is not turned on, while the switch S23 in each parallel output latch 24 is turned on. Thus, the signal latched in the ratio latch L21 in each master latch 22 is provided to the ratio latch L23 in each parallel output latch 24 and latched.

As described above, the serial signal provided to the serial input terminal 25 is shifted within a plurality of register circuits 21 in response to the first and second clock signals CLK1, CLK2, and output as the parallel output signals DO (0) to DO (n−1), in response to the trigger clock signal TRG.

In the parallel/serial conversion circuit 10a in FIG. 8, the control signal S1 for controlling the switch S11 in each master latch 12 is provided by an AND operation of the first clock signal CLK1 and the trigger clock signal /TRG. Therefore, as indicated by a broken line in FIG. 10, timings for a first clock signal CLK1 and a trigger clock signal /TRG are shifted from each other, resulting in a problem.

More specifically, if the trigger clock signal /TRG falls before the first clock signal CLK1 rises, and the trigger clock signal /TRG rises before the first clock signal CLK1 falls, a pulse as depicted by the broken line is generated in the control signal S1.

As a result, after the switch S13 in each master latch 12 is turned on during a period T1 in which the trigger signal TRG is in an "H" level, the switch S11 is turned on in a period T2 in which the control signal S1 is in an "H" level. Thus, the parallel input signal input to the ratio latch L11 by the conduction of the switch S13 can be replaced with a signal provided from the slave latch 13 of the preceding stage by the conduction of the switch S11.

Thus, erroneous operations can possibly take place in the parallel/serial conversion circuit 10a shown in FIG. 8.

In the serial/parallel conversion circuit 20a in FIG. 11, the control signal S2 for controlling the switch S22 in each slave latch 23 is provided by an AND operation of the second clock signal CLK2 and the trigger clock signal /TRG. Therefore, as indicated by the broken line shown in FIG. 13, a problem is encountered when timings for the second clock signal CLK2 and the trigger clock signal /TRG are shifted from each other.

More specifically, when the trigger clock signal /TRG falls after the second clock signal CLK2 rises, and the trigger clock signal /TRG rises after the second clock signal CLK2 falls, a pulse as depicted by the broken line in the figure is generated in the control signal S2.

As a result, after the switch S22 in each slave latch 23 is turned on during a period T3 in which the control signal S2 is in an "H" level, the switch S23 in each parallel output latch 24 is turned on during a period T4 in which the trigger clock signal TRG is in an "H" level. Consequently, after the inverter G21 in the ratio latch L21 drives the inverter G23 by the conduction of the switch S22 while competing with the weak inverter G24 in the ratio latch L22, the inverter G21 in the ratio latch L21 will drive the inverter G25 by the conduction of the switch 23 while competing with the weak inverter G26. Therefore, the signal held in the ratio latch L23 will become unstable.

As described above, in the serial/parallel conversion circuit 20a in FIG. 11, erroneous operations can possibly take place by the shifting of the trigger signal /TRG.

SUMMARY OF THE INVENTION

It is an object of the invention to provide a parallel/serial conversion circuit without any erroneous operation.

Another object of the invention is to provide a serial/parallel conversion circuit without any erroneous operation.

Yet another object of the invention is to provide a system including a serial/parallel conversion circuit and a parallel/serial conversion circuit both without any erroneous operations.

A parallel/serial conversion circuit for converting a plurality of parallel signals into a serial signal in accordance with an aspect of the invention includes a plurality of registers provided correspondingly to the plurality of parallel signals and connected in serial with each other. Each of the plurality of registers includes first and second holding circuits.

The first holding circuit includes a first latch circuit, a first switch, and a second switch. The first switch supplies a signal provided from a preceding stage to the first latch circuit, in response to a first clock signal. The second switch supplies a corresponding parallel signal to the first latch circuit, in response to a prescribed control signal.

The second holding circuit includes a second latch circuit and a third switch. The third switch supplies a signal provided from the first holding circuit to the second latch circuit, in response to a second clock signal.

The second latch circuit includes a first inverter of a tri-state type, and a second inverter. The first inverter receives the signal from the third switch and attains a high impedance state in response to the control signal. The second inverter is connected in antiparallel to the first inverter and has a smaller driving capability than the first inverter.

First, in response to the control signal, a corresponding parallel signal is supplied to each first latch circuit through the second switch and held therein. Then, in response to the second clock signal, the signal held in each first latch circuit is transferred to each second latch circuit through the third switch and held therein. In response to the first clock signal, the signal held in the second latch circuit is transferred to the first latch circuit of the succeeding stage through the first switch of the succeeding stage and held therein.

Thereafter, in response to the second and first clock signals, signals held in the registers are sequentially transferred to the registers of succeeding stages, and output as a sequential serial signal from the register of the final stage.

When the parallel signal is supplied to each first latch circuit in response to the control signal, the first inverter constituting the second latch circuit attains a high impedance state. Therefore, even if the first switch is turned on at that time, the signal held in each first latch circuit will never be inverted by the first inverter in the second latch circuit of the preceding stage.

As described above, since the first inverter constituting each second latch circuit attains a high impedance state when the parallel signal is input into each first latch circuit, the signal held in each first latch circuit will never be inverted by the first inverter in the second latch circuit of the preceding stage even if the first switch is turned on. Therefore, a parallel/serial conversion circuit without any erroneous operation can be provided.

A serial/parallel conversion circuit for converting a serial signal into a plurality of parallel signals in accordance with another aspect of the invention includes a plurality of registers provided correspondingly to the plurality of parallel signals and connected in series with each other. Each of the plurality of registers includes first, second, and third holding circuits.

The first holding circuit includes a first latch circuit, and a first switch. The first switch supplies a signal provided from the preceding stage to the first latch circuit, in response to a first clock signal.

The second holding circuit includes a second latch circuit, and a second switch. The second switch supplies a signal provided from the first holding circuit to the second latch circuit, in response to a second clock signal.

The third holding circuit includes a third latch circuit, and a third switch. The third switch supplies a signal provided from the first holding circuit to the third latch circuit as a parallel signal, in response to a prescribed control signal.

The second latch circuit includes a first inverter, and a second inverter of a tri-state type. The first inverter receives the signal from the second switch. The second inverter is connected to the first inverter in antiparallel, has a driving capability smaller than the first inverter and attains a high impedance state in response to the control signal.

First, in response to the first clock signal, a serial signal is supplied to each first latch circuit through the first switch and held therein. In response to the second clock signal, the signal held in each first latch circuit is transferred to each second latch circuit through the second switch and held therein. Thereafter, in response to the first and second clock signals, signals held in the registers are sequentially transferred to the registers of the succeeding stages and held therein.

Then, in response to the control signal, the signal held in each first latch circuit is supplied to each third latch circuit through the third switch and held therein. The signal held in each third latch circuit is output as a parallel signal.

When the signal held in each first latch circuit in response to the control signal is supplied to each third latch circuit, the second inverter constituting each second latch circuit attains a high impedance state. Therefore, the output signal of each first latch circuit will never become unstable even if the second switch is turned on.

As described above, when a parallel signal is output to each third latch circuit, the second inverter constituting each second latch circuit attains a high impedance stage, and, therefore, the output signal of the first latch circuit will never be unstable even if the second switch is turned on. Therefore, a serial/parallel conversion circuit without any erroneous operation can be provided.

A system in accordance with yet another aspect of the invention includes a clock signal generator, a control signal generator, a serial/parallel conversion circuit, a prescribed circuit and a parallel/serial conversion circuit.

The clock signal generator generates first and second clock signals in response to a reference clock signal. The control signal generator generates a control signal in response to a frame pluse. The serial/parallel conversion circuit converts a serial signal into a plurality of parallel signals. The prescribed circuit receives the plurality of parallel signals converted by the serial/parallel conversion circuit and outputs a plurality of parallel signals. The parallel/serial conversion circuit converts the plurality of parallel signals output from the prescribed circuit into a serial signal.

The serial/parallel conversion circuit includes a plurality of registers provided correspondingly to the plurality of parallel signals and connected in serial with each other. Each of the plurality of registers includes first, second, and third holding circuits.

The first holding circuit includes a first latch circuit, and a first switch.

The first switch supplies a signal provided from a preceding stage to the first latch circuit, in response to the first clock signal.

The second holding circuit includes a second latch circuit, and a second switch. The second switch supplies a signal provided from the first holding circuit to the second latch circuit, in response to the second clock signal. The third holding circuit includes a third latch circuit, and a third switch. The third switch supplies a signal provided from the first holding circuit to the third latch circuit as a parallel signal, in response to the control signal.

The second latch circuit includes a first inverter, and a second inverter of a tri-state type. The first inverter receives the signal from the second switch. The second inverter is connected in antiparallel to the first inverter and has a driving capability smaller than the first inverter. The second inverter attains a high impedance state in response to the control signal.

The parallel/serial conversion circuit includes a plurality of registers provided correspondingly to a plurality of parallel signals and connected in serial with each other. Each of the plurality of registers includes fourth and fifth holding circuits.

The fourth holding circuit includes a fourth latch circuit, a fourth switch, and a fifth switch. The fourth switch supplies a signal from a preceding stage to the fourth latch circuit, in response to the first clock signal. The fifth switch supplies a corresponding parallel signal to the fourth latch circuit in response to the control signal.

The fifth holding circuit includes a fifth latch circuit and a sixth switch. The six switch supplies a signal from the fourth holding circuit to the fifth latch circuit, in response to the second clock signal.

The fifth latch circuit includes a third inverter of a tri-state type, and a fourth inverter. The third inverter receives a signal from the sixth switch and attains a high impedance state in response to the control signal. The fourth inverter is connected to the third inverter in antiparallel and has a smaller driving capability than the third inverter.

The serial/parallel conversion circuit included in this system operates in the same manner as the above-stated serial/parallel conversion circuit. The parallel/serial conversion circuit included in this system operates in the same manner as the above-stated parallel/serial conversion circuit.

As in the foregoing, a system without any erroneous operations can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Figure 1:
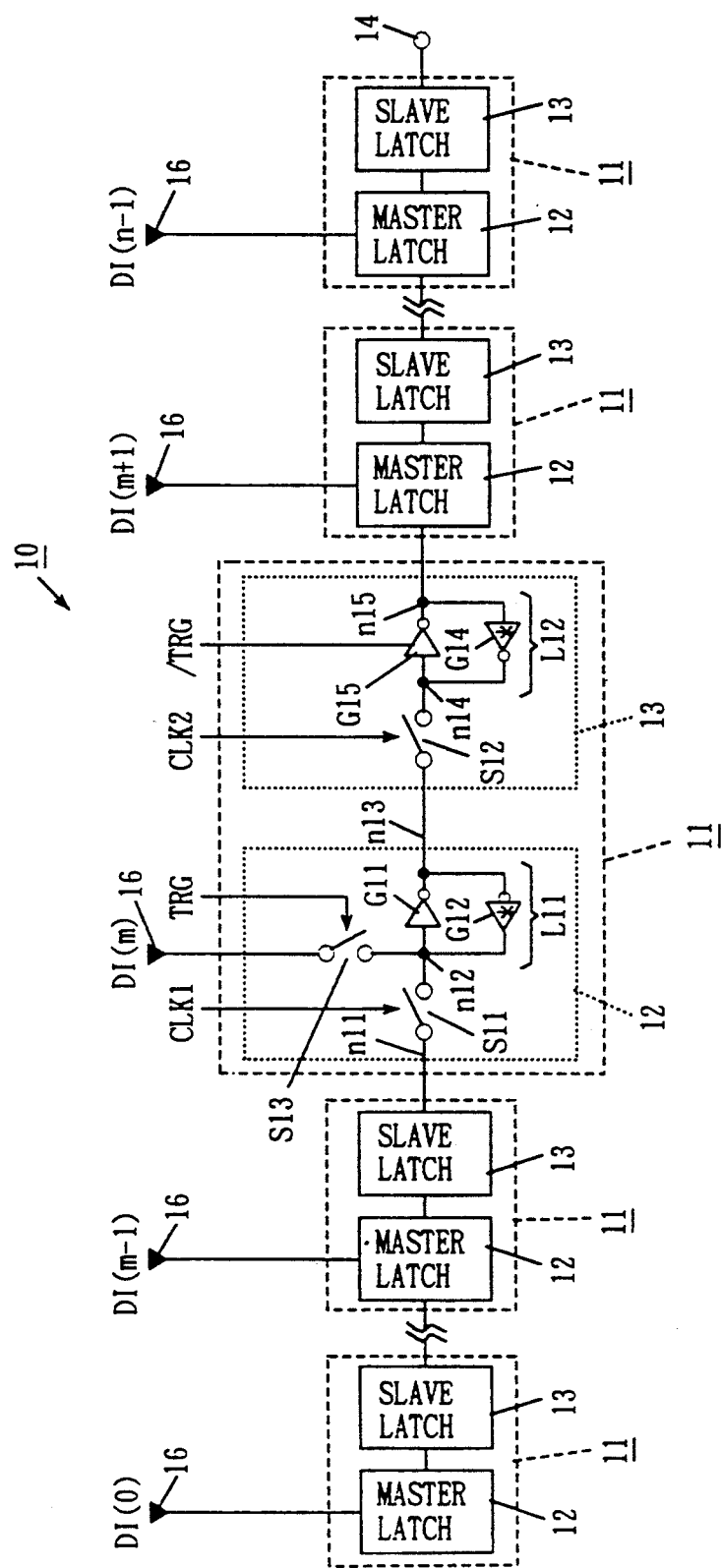
FIG. 1 is a diagram showing a construction of a parallel/serial conversion circuit in accordance with a first embodiment.
Figure 8:
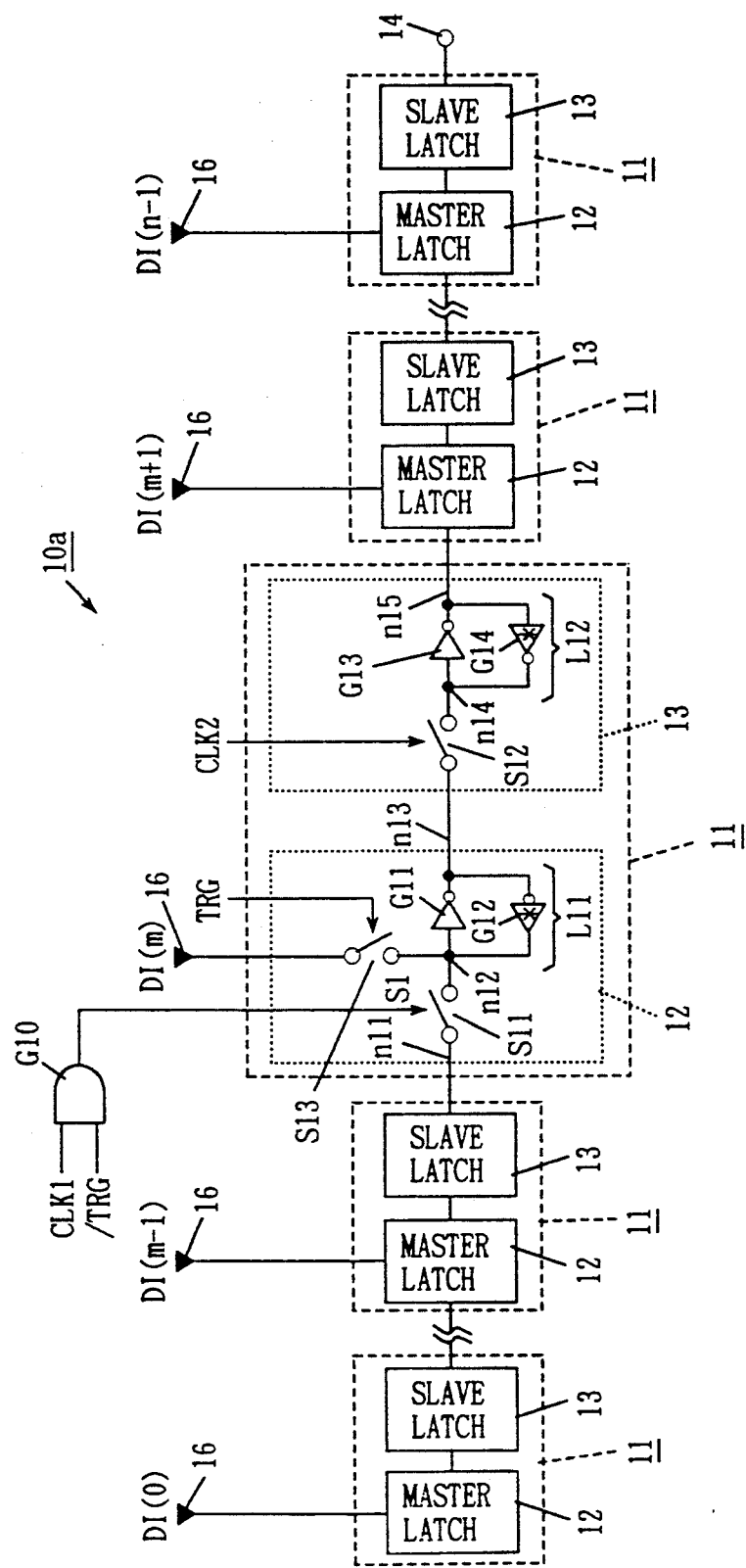
FIG. 8 is a diagram showing a construction of a conventional parallel/serial conversion circuit.
Figure 9:
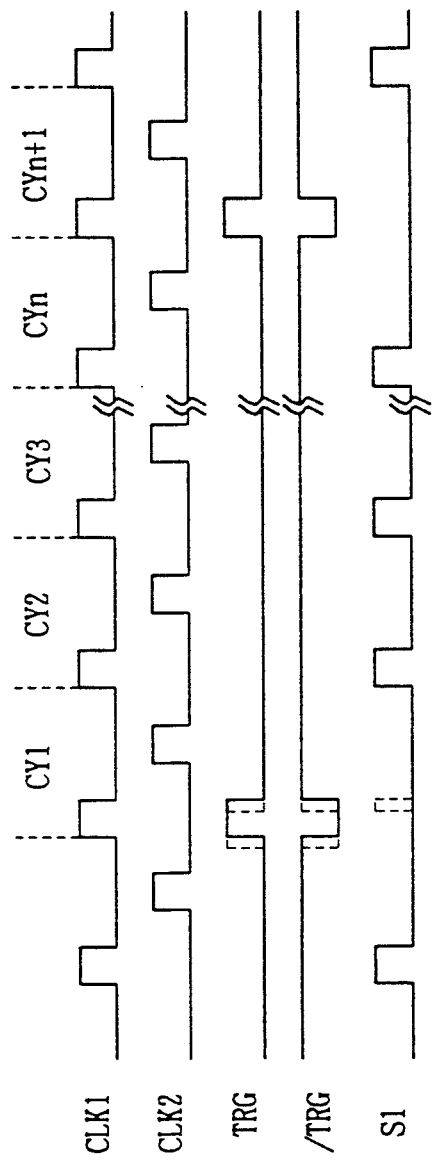
FIG. 9 is a timing chart for use in illustration of an operation of the parallel/serial conversion circuit shown in FIG. 8.
Figure 10:
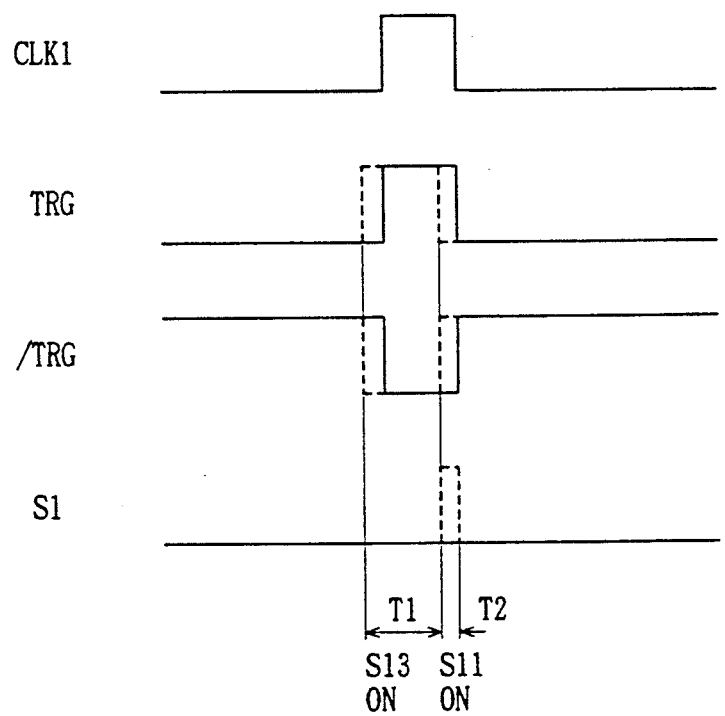
FIG. 10 is a representation for use in illustration of problems associated with the parallel/serial conversion circuit shown in FIG. 8.

FIG. 1 is a diagram showing a construction of a parallel/serial conversion circuit in accordance with a first embodiment. The parallel/serial conversion circuit 10 in FIG. 1 has a substantially identical construction to the parallel/serial conversion circuit 10a in FIG. 8 with an essential difference as follows.

The ratio latch L12 included in each slave latch 13 is formed of a tri-state inverter G15 and a weak inverter G14. The tri-state inverter G15 is connected between a node n14 and a node n15, while the weak inverter G14 is connected to a tri-state inverter G15 in antiparallel between a node n15 and the node n14. The control terminal of the tri-state inverter G15 is provided with a trigger clock signal /TRG.

The ratio of the gate width to the gate length of a transistor included in the weak inverter G14 is set to be about 1/5 the ratio of the gate width to the gate length of a transistor included in the tri-state inverter G15. Thus, the weak inverter G14 will have a current driving capability about 1/5 that of the tri-state inverter G15.

A switch S11 included in each master latch 12 is controlled by a first clock signal CLK1. A shift register for transferring a signal by the first and second clock signals CLK1, CLK2 is formed of n register circuits 11. The structures of the other parts are the same as those shown in FIG. 8.

Figure 2:
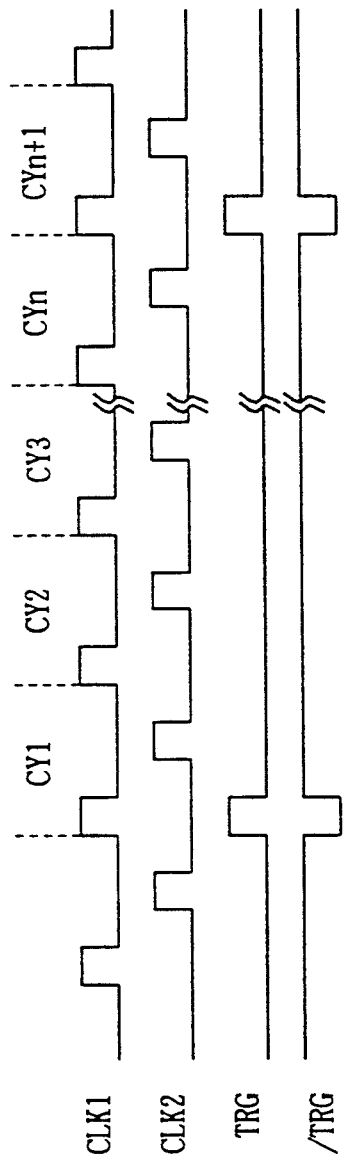
FIG. 2 is a timing chart for use in illustration of an operation of the parallel/serial conversion circuit shown in FIG. 1.

Now, a description of an operation of the parallel/serial conversion circuit 10 shown in FIG. 1 follows in conjunction with a timing chart in FIG. 2.

In a cycle CY1, the trigger clock signal TRG attains an "H" level. Thus, the switch S13 in each master latch 12 is turned on, a parallel input signal DI (m) applied to each parallel input terminal 16 is provided to the ratio latch L11 and held therein. Herein, m represents an integer from 0 to n−1.

At that time, since the first clock signal CLK1 is in the "H" level, the switch S11 in each master latch 12 is also turned on. However, the trigger clock signal /TRG is pulled to "L", the tri-state inverter G15 constituting the ratio latch L12 in each slave latch 13 attains a high impedance state. Therefore, even if the switch S11 in each master latch 12 is turned on, a signal will never be applied to the ratio latch L11 from the slave latch 13 of the preceding stage through the switch S11.

Then, when the second clock signal CLK2 attains an "H" level, the switch S12 in each slave latch 13 is turned on. Thus, the signal held in the ratio latch L11 in each mater latch 12 is transferred to the ratio latch L12 in each slave latch 13 and held therein.

In a cycle CY2, when the first clock signal CLK1 attains an "H" level, the switch S11 in each master latch 12 is turned on. Thus, the signal held in the ratio latch L12 in the slave latch 13 of the preceding stage is transferred to the ratio latch L11 in each master latch 12 and held therein.

Then, when the second clock signal CLK2 attains an "H" level, the switch S12 in each slave latch 13 is turned on. Thus, the signal held in the ratio latch L11 in each mater latch 12 is transferred to the ratio latch L12 in each slave latch 13 and held therein.

Also in cycles CY3-CYn, the same operation as in the cycle CY2 is conducted.

As described above, the parallel input signals DI (0)-DI (n−1) applied to the parallel input terminals 16 are sequentially shifted within the plurality of register circuits 11 and sequentially output as serial signals from the serial output terminal 14.

In the parallel/serial conversion circuit 10 in accordance with this embodiment, the tri-state inverter G15 in each ratio latch L12 attains a high impedance state during a period when each parallel input signal DI (m) is input to a corresponding ratio latch L11 through the switch S13. Therefore, if the switch S11 is turned on, a signal will never be applied to the ratio latch L11 from the slave latch 13 of the preceding stage.

Figure 3:
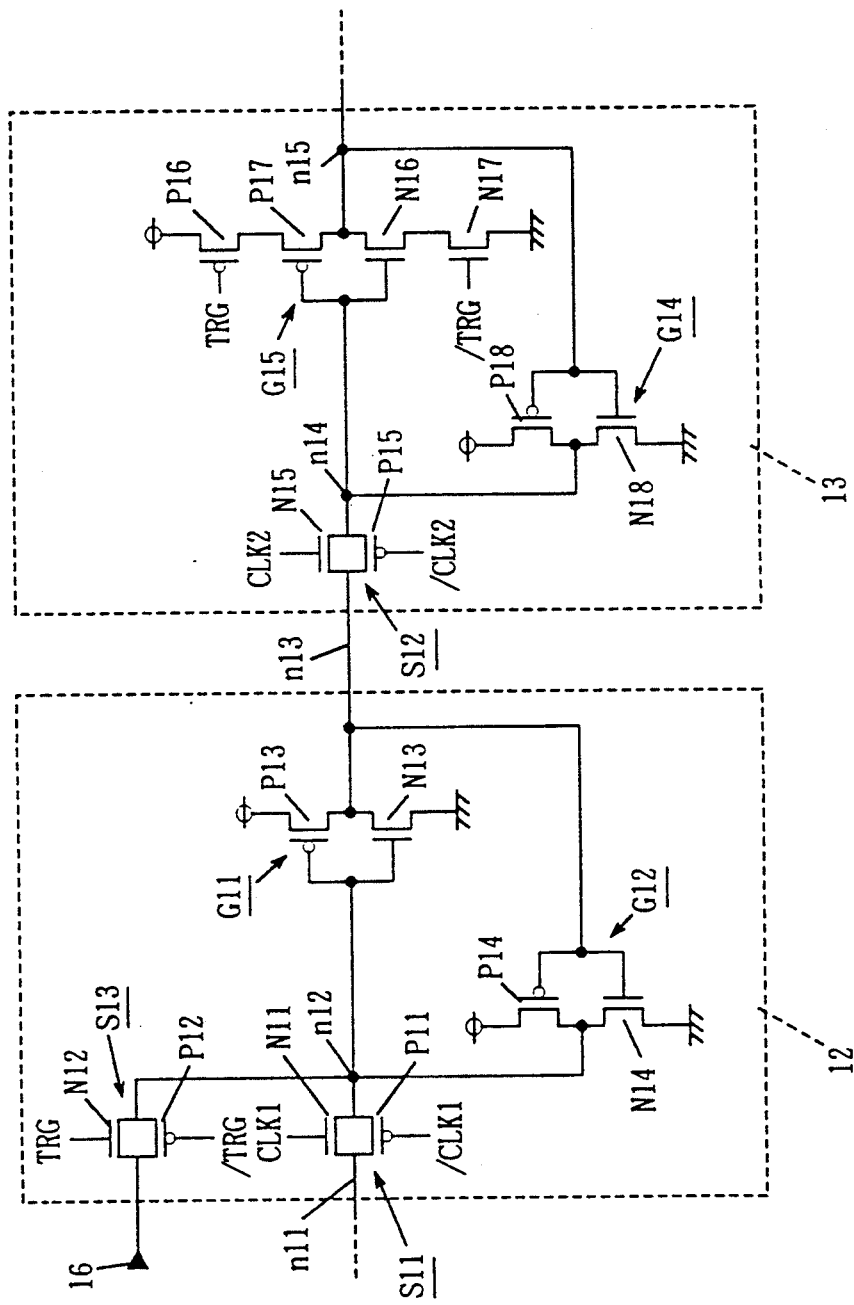
FIG. 3 is a circuit diagram showing in detail constructions of a master latch and a slave latch included in the parallel/serial conversion circuit shown in FIG. 1.

FIG. 3 is a circuit diagram showing in detail the constructions of the master latch 12 and the slave latch 13.

In the master latch 12, the switch S11 includes an NMOS transistor N11 and a PMOS transistor P11. The first clock signal CLK1 is applied to the gate of the transistor N11, while an inverted signal /CLK1 of the first clock signal CLK1 is applied to the gate of the transistor P11. The switch S13 includes an NMOS transistor N12 and a PMOS transistor P12. A trigger clock signal TRG is applied to the gate of the transistor N12, while a trigger clock signal /TRG is applied to the gate of the transistor P12. The trigger clock signal /TRG is the inverse of the trigger clock signal TRG.

The inverter G11 includes a PMOS transistor P13 and an NMOS transistor N13. The weak inverter G12 includes a PMOS weak transistor P14 and an NMOS weak transistor N14.

In the slave latch 13, the switch S12 includes an NMOS transistor N15 and a PMOS transistor P15. The second clock signal CLK2 is applied to the gate of the transistor N15, while an inverted signal /CLK2 of the second clock signal CLK2 is applied to the gate of the transistor P15.

The tri-state inverter G15 includes PMOS transistors P16, P17, and NMOS transistors N16, N17. The transistors P16, P17 are connected in serial between a power supply terminal and the node n15. The transistors N16, N17 are connected in serial between the node n15 and a ground terminal. The trigger clock signal TRG is applied to the gate of the transistor P16. The gates of the transistors P17, N16 are connected to the node n14. The trigger clock signal /TRG is applied to the gate of the transistor N17.

The weak inverter G14 includes a PMOS weak transistor P18 and an NMOS weak transistor N18.

The sizes (the ratio of the gate width and the gate length) of the PMOS weak transistors P14, P18 are set to be about 1/5 the sizes of the other PMOS transistors. The sizes of the NMOS weak transistors N14, N18 are set to be about 1/5 the sizes of the other NMOS transistors.

Once the trigger clock signal TRG attains an "L" level, and the trigger clock signal /TRG attains an "H" level, the transistors P16 and N17 are turned on. Thus, the tri-state inverter G15 functions as an inverter. Meanwhile, when the trigger clock signal TRG attains an "H" level and the trigger clock signal /TRG attains an "L" level, the transistors P16 and N17 are turned off. Accordingly, the tri-state inverter G15 attains a high impedance state.

As shown in FIG. 3, the tri-state inverter G15 is formed of four transistors. Therefore, addition of two transistors provides the parallel/serial conversion circuit 10 in accordance with this embodiment.

(2) Second Embodiment

Figure 4:
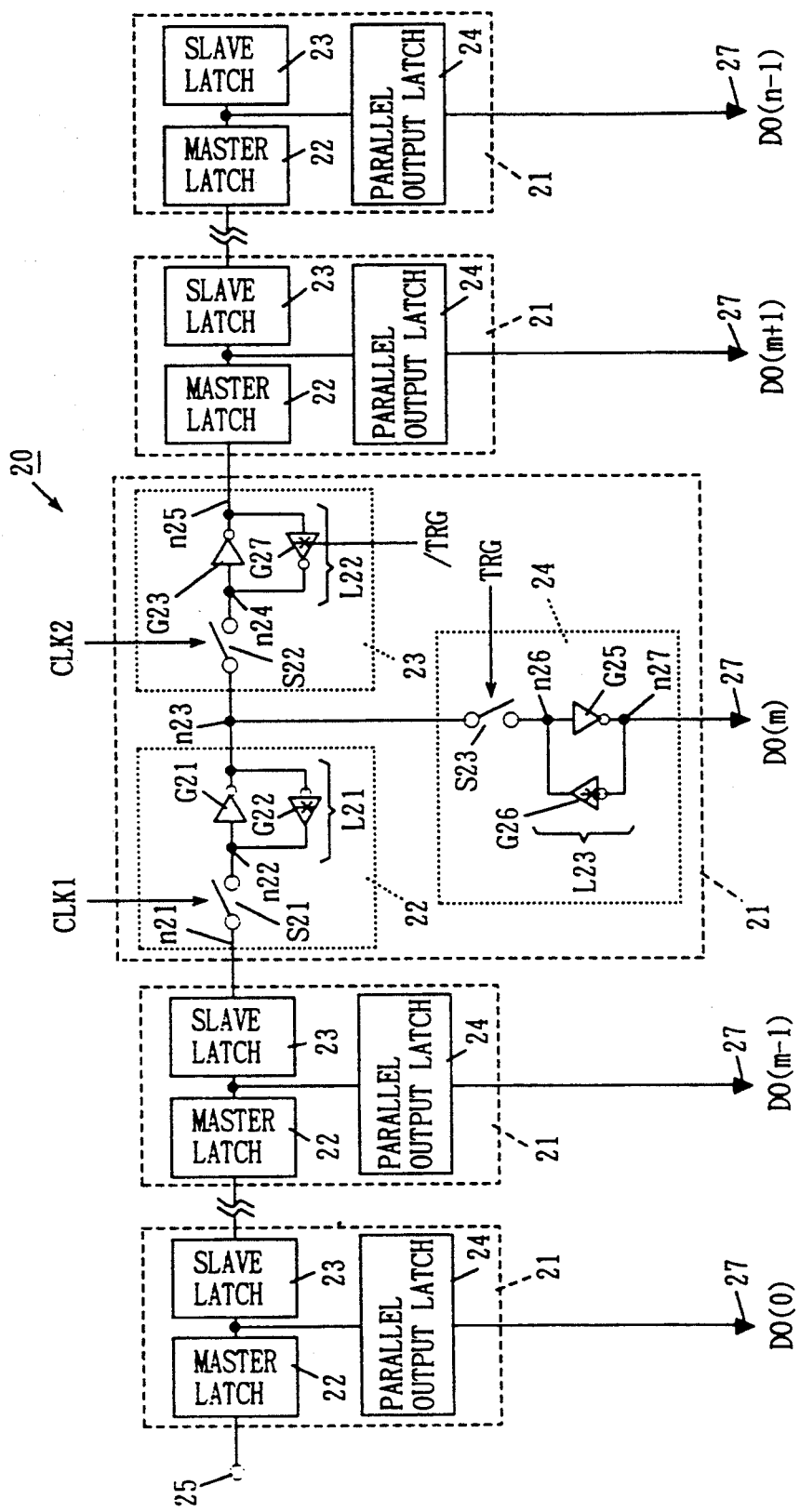
FIG. 4 is a diagram showing a construction of a serial/parallel conversion circuit in accordance with a second embodiment.
Figure 11:
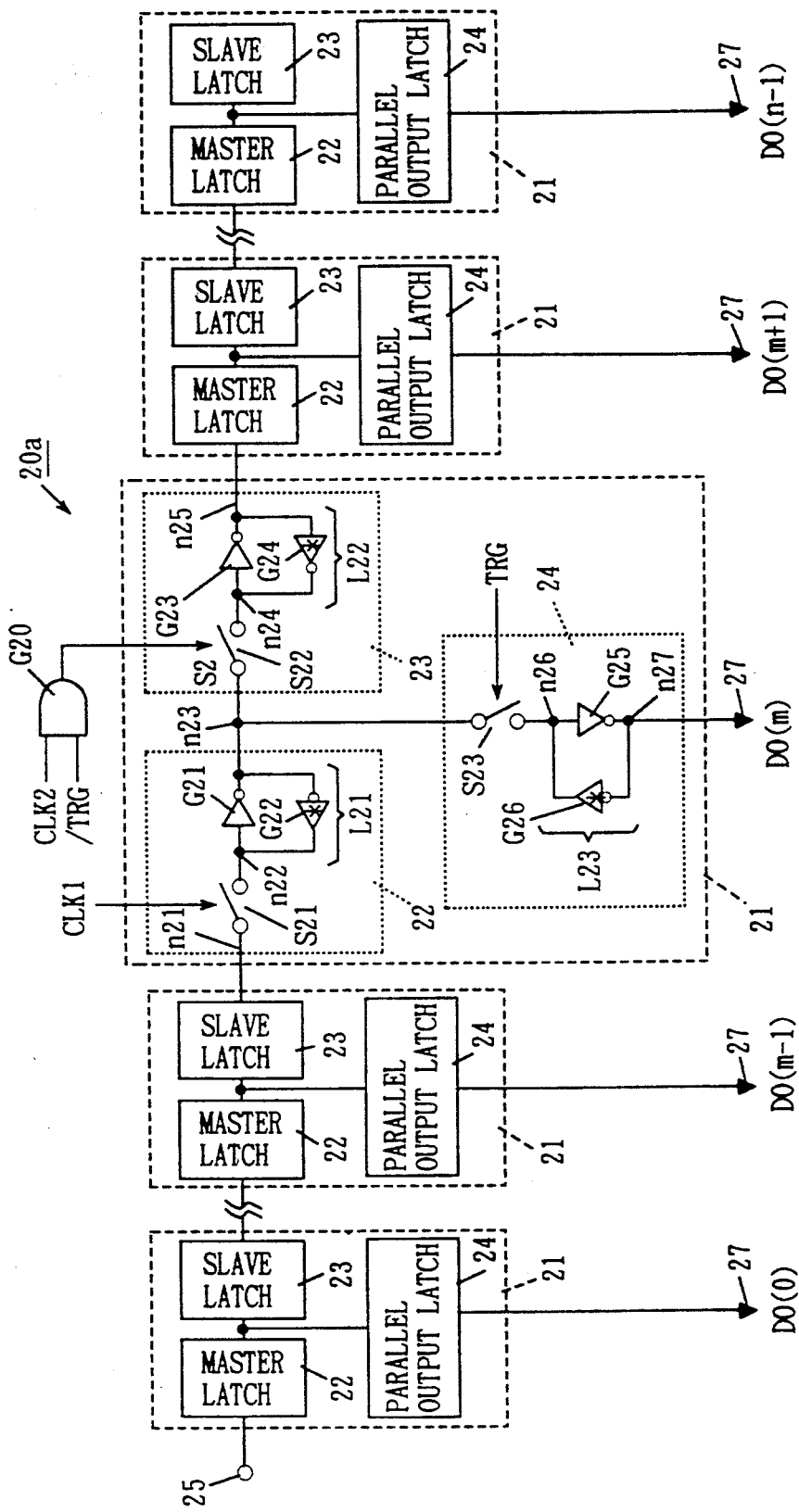
FIG. 11 is a diagram showing a construction of a conventional serial/parallel conversion circuit.
Figure 12:
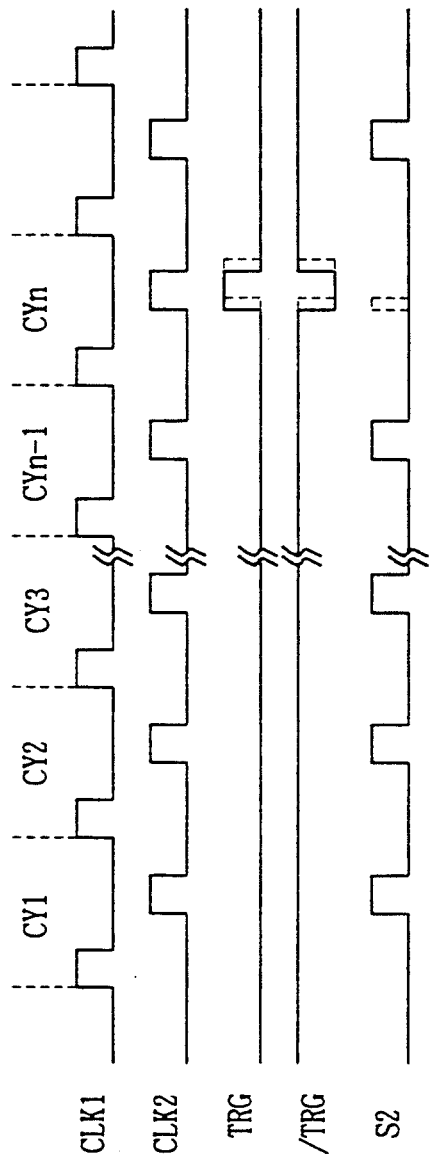
FIG. 12 is a timing chart for use in illustration of an operation of the serial/parallel conversion circuit shown in FIG. 11.
Figure 13:
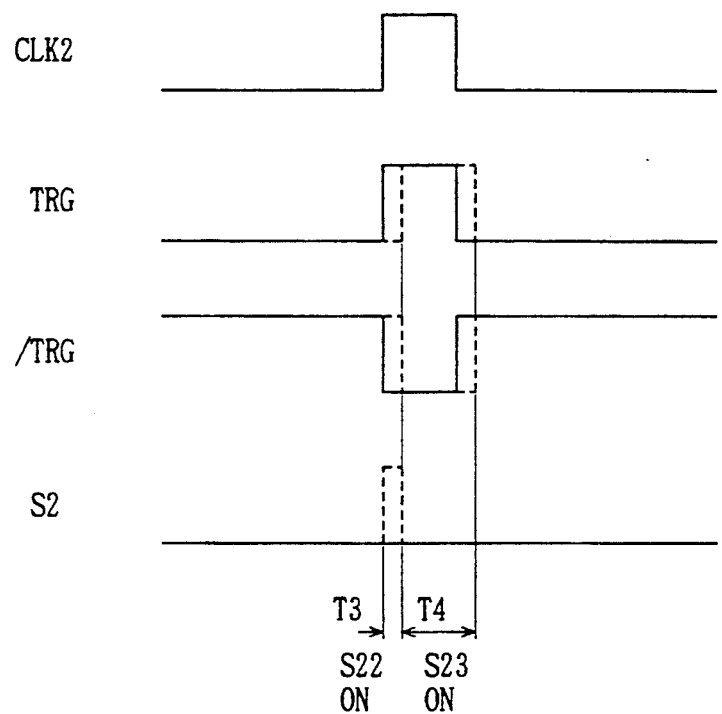
FIG. 13 is a representation for use in illustration of problems associated with the serial/parallel conversion circuit shown in FIG. 11.

FIG. 4 is a diagram showing a construction of a serial/parallel conversion circuit in accordance with a second embodiment. The serial/parallel conversion circuit 20 in FIG. 4 is substantially identical to the serial/parallel conversion circuit 20a shown in FIG. 11 with an essential difference as follows.

A ratio latch L22 included in each slave latch 23 is formed of an inverter G23 and a tri-state weak inverter G27. The inverter G23 is connected between a node n24 and a node n25, while the tri-state weak inverter G27 is connected to the inverter G23 in antiparallel between the node n25 and the node n24. The control terminal of the tri-state weak inverter G27 is provided with a trigger clock signal /TRG.

The ratio of the gate width and the gate length of a transistor included in the tri-state weak inverter G27 is set to be about 1/5 the ratio of the gate width and the gate length of a transistor included in the inverter G23. Thus, the tri-state weak inverter G27 will have a current driving capability about 1/5 that of the inverter G23.

A switch S22 included in each slave latch 23 is controlled by a second clock signal CLK2. A shift register for transferring a signal by the first and second clock signals CLK1, CLK2 is formed of n register circuit 21. The structure of the other portions are the same as those shown in FIG. 11.

Figure 5:
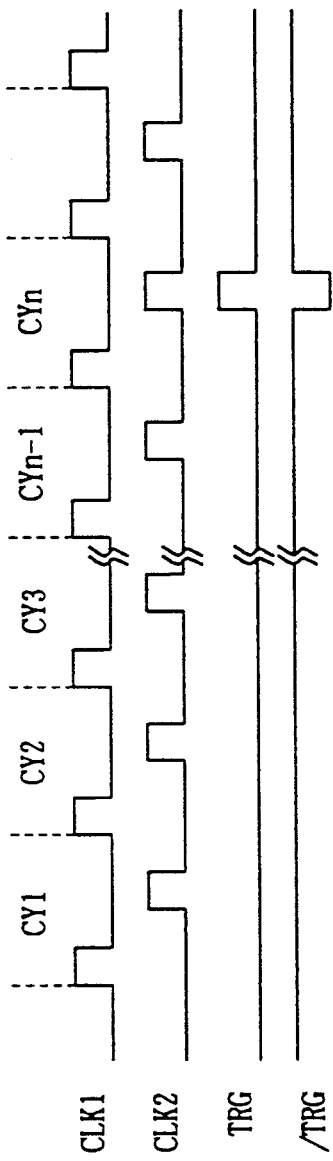
FIG. 5 is a timing chart for use in illustration of an operation of the serial/parallel conversion circuit shown in FIG. 4.

Now, a description of an operation of the serial/parallel conversion circuit 20 shown in FIG. 4 follows in conjunction with a timing chart shown in FIG. 5.

In a cycle CY1, when the first clock signal CLK1 attains an "H" level, a switch S21 in each master latch 22 is turned on. Thus, a signal held in the slave latch 23 of the preceding stage is transferred to a ratio latch L21 in each master latch 22 and held therein.

When the second clock signal CLK2 is pulled to an "H" level, a switch S22 in each slave latch 23 is turned on. Thus, the signal held in the ratio latch L21 in each master latch 22 is transferred to the ratio latch L22 in each slave latch 23 and held therein.

Also in cycles CY2-CYn−1, the same operation as in the cycle CY1 is conducted.

In a cycle CYn, when the first clock signal CLK1 is pulled to "H", the switch S21 in each master latch 22 is turned on. Thus, the signal held in the ratio latch L22 in the slave latch 23 of the preceding stage is transferred to the ratio latch L21 in each master latch 22 and held therein.

When the trigger clock signal TRG is pulled to "H", the switch S23 in each parallel output latch 24 is turned on. Thus, the signal held in the ratio latch L21 in each master latch 22 is transferred to the ratio latch L23 in each parallel output latch 24 and held therein. The signal held in each ratio latch L23 is output as a parallel output signal DO (m) to a parallel output terminal 27. Herein, m represents an integer from 0 to n−1.

At that time, since the second clock signal CLK2 also attains an "H" level, the switch S22 in each slave latch 23 is also turned on. However, since the trigger clock signal /TRG is pulled to "L", the tri-state weak inverter G27 of the ratio latch L22 attains a high impedance state.

Therefore, even if the switch S22 is turned on, the inverter G21 in the ratio latch L21 will not compete with the tri-state weak inverter G27 in the ratio latch L22, but compete only with the weak inverter G26 in the ratio latch L23. Consequently, the signal applied from the ratio latch L21 to the ratio latch L23 is stabilized.

As described above, the serial signal applied to a serial input terminal 25 is sequentially shifted within the plurality of register circuits 21, and output as parallel output signals DO (0)-DO (n−1) from parallel output terminals 27.

As described above, in the serial/parallel conversion circuit 20 in accordance with this embodiment, during a period in which the parallel output signal is applied from each ratio latch L21 to each ratio latch L23, the tri-state weak inverter G27 in each ratio latch L22 attains a high impedance state. Therefore, even if the switch S22 is turned on, the output signal of the ratio latch L21 is stable.

Figure 6:
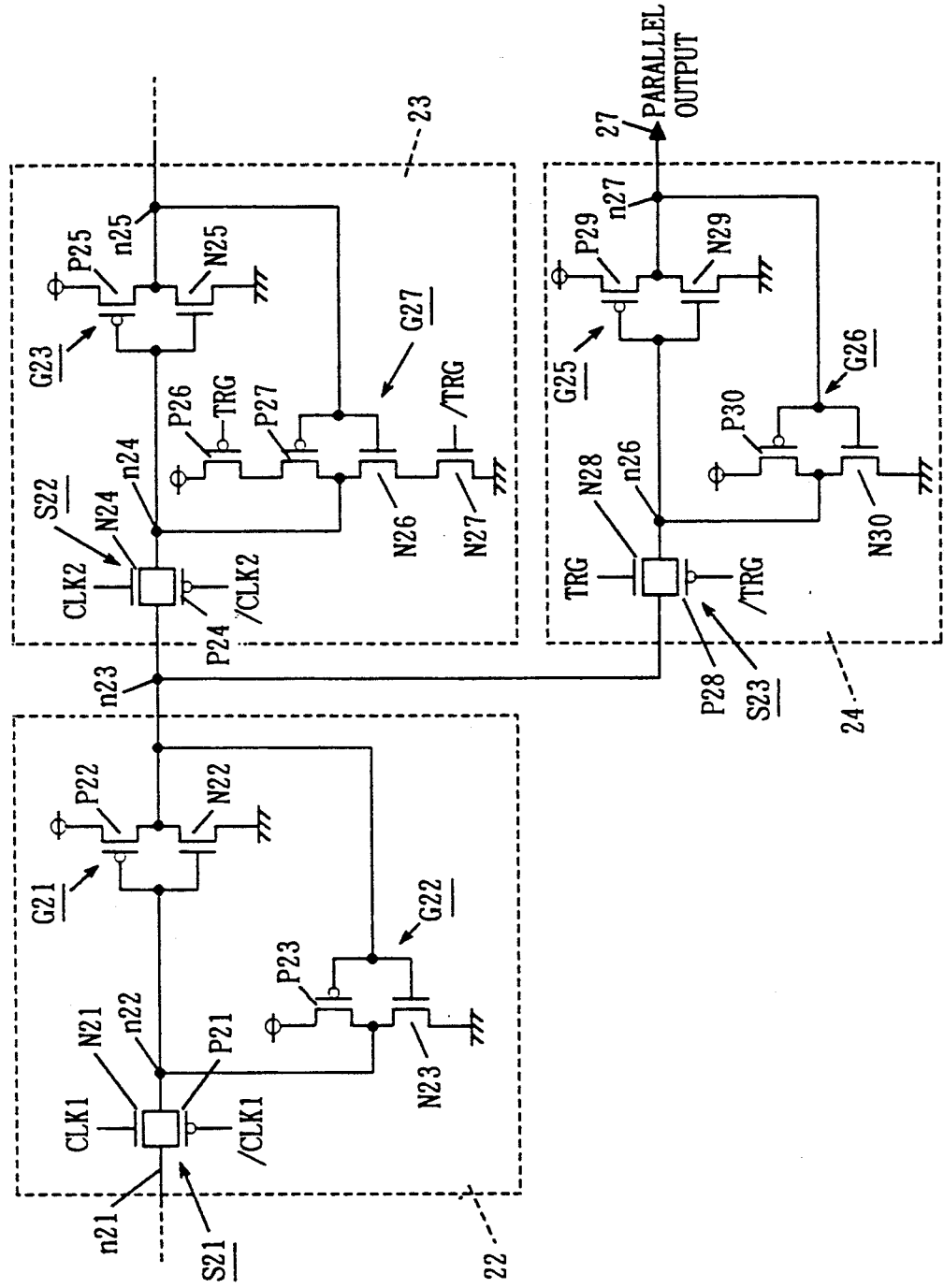
FIG. 6 is a circuit diagram showing in detail constructions of a master latch, a slave latch, and a parallel output latch included in the serial/parallel conversion circuit shown in FIG. 4.

FIG. 6 is a circuit diagram showing in detail the structures of the master latch 22, the slave latch 23, and the parallel output latch 24.

In the master latch 22, the switch S21 includes an NMOS transistor N21 and a PMOS transistor P21. The gate of the transistor N21 is provided with the first clock signal CLK1, while the gate of the transistor P21 is provided with an inverted signal /CLK1 of the first clock signal CLK1.

An inverter G21 includes a PMOS transistor P22 and an NMOS transistor N22. A weak inverter G22 includes a PMOS weak transistor P23 and an NMOS weak transistor N23.

In the slave latch 23, the switch S22 includes an NMOS transistor N24 and a PMOS transistor P24. The gate of the transistor N24 is provided with the second clock signal CLK2, while the gate of the transistor P24 is provided with an inverted signal /CLK2 of the second clock signal CLK2.

The inverter G23 includes a PMOS transistor P25 and an NMOS transistor N25.

The tri-state weak inverter G27 includes a PMOS transistor P26, a PMOS weak transistor P27, an NMOS weak transistor N26 and an NMOS transistor N27. The transistors P26 and P27 are connected in serial between a power supply terminal and the node n24. The transistors N26 and N27 are connected in serial between the node n24 and a ground terminal. The gate of the transistor P26 is provided with the trigger clock signal TRG. The gates of the transistors P27 and N26 are connected to the node n25. The gate of the transistor N27 is provided with the trigger clock signal /TRG.

In the parallel output latch 24, the switch S23 includes an NMOS transistor N28 and a PMOS transistor P28. The gate of the transistor N28 is provided with the trigger clock signal TRG, while the gate of the transistor P28 is provided with the trigger clock signal /TRG.

The inverter G25 includes a PMOS transistor P29 and an NMOS transistor N29. The weak inverter G26 includes a PMOS weak transistor P30 and an NMOS weak transistor N30.

The sizes (the ratio of the gate width and the gate length) of the PMOS weak transistors P23, P27, and P30 are set to be about 1/5 the sizes of the other PMOS transistors. The sizes of the NMOS weak transistors N23, N26, and N30 are set about 1/5 the sizes of the other NMOS transistors.

When the trigger clock signal TRG is pulled to "L" and the trigger clock signal /TRG is pulled to "H", the transistors P26 and N27 are turned on. Thus, the tri-state weak inverter G27 functions as a weak inverter. When the trigger clock signal TRG attains an "H" level and the trigger clock signal /TRG attains an "L" level, the transistors P26 and N27 are turned off. Thus, the tri-state weak inverter G27 attains a high impedance state.

As shown in FIG. 6, the tri-state weak inverter G27 is formed of four transistors. Therefore, addition of only two more transistors can provide the serial/parallel conversion circuit 20 in accordance with this embodiment.

(3) Third Embodiment

Figure 7:
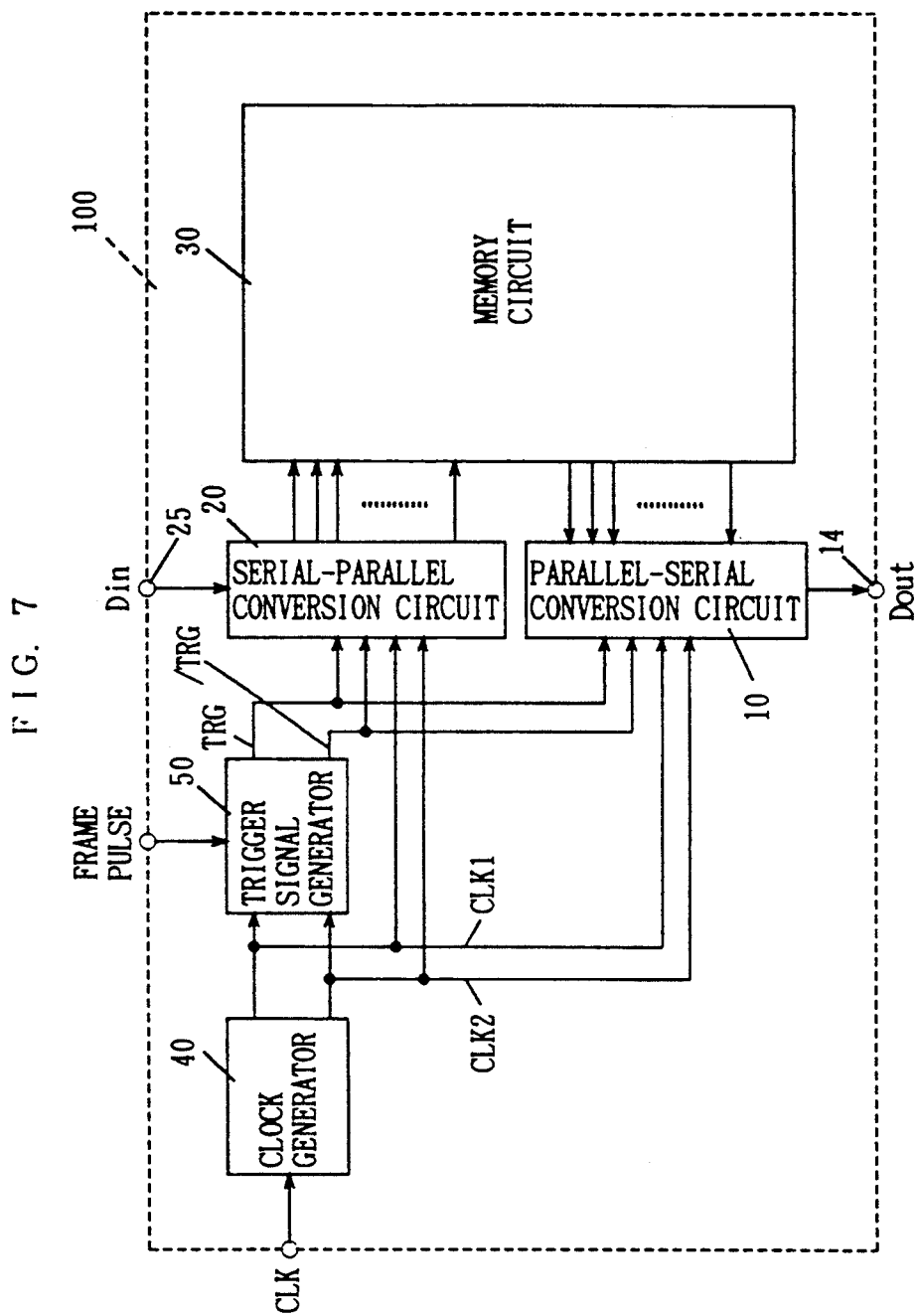
FIG. 7 is a block diagram showing a construction of a system in accordance with a third embodiment.

FIG. 7 is a block diagram showing a construction of a system in accordance with a third embodiment. The system 100 in FIG. 7 includes a parallel/serial conversion circuit 10, a serial/parallel conversion circuit 20, a memory circuit 30, a clock generator 40, and a trigger signal generator 50. This system 100 may be formed on a single semiconductor chip.

The clock generator 40 receives a reference clock signal CLK and generates a first clock signal CLK1 and a second clock signal CLK2. The trigger signal generator 50 receives the first clock signal CLK1 and the second clock signal CLK2 and generates trigger clock signals TRG and /TRG in response to a frame pulse.

The serial/parallel conversion circuit 20 converts a serial input signal Din applied to a serial input terminal 25 into parallel output signals, in response to the first clock signal CLK1, the second clock signal CLK2, and the trigger clock signals TRG and /TRG, and applies the signals to a memory circuit 30.

The parallel/serial conversion circuit 10 converts the parallel output signals applied from the memory circuit 30 into a serial output signal Dout in response to the first clock signal CLK1, the second clock signal CLK2, and the trigger clock signals TRG and /TRG and applies the signal to a serial output terminal 14.

As is the case with the system 100 shown in FIG. 7, the use of the serial/parallel conversion circuit 20 and the parallel/serial conversion circuit 10 for input of data into the memory circuit 30 and output of data from the memory circuit 30, respectively makes it possible to couple an external device with a high operating speed and the memory circuit 30 with a low operating speed.

The parallel/serial conversion circuit and the serial/parallel conversion circuit in accordance with the invention are not limited to the system 100 shown in FIG. 7 but can be applied to various systems, circuits, etc.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A parallel/serial conversion circuit for converting a plurality of parallel signals into a serial signal, comprising:

a plurality of register means provided correspondingly to said plurality of parallel signals and connected in serial, wherein each of said plurality of register means includes first holding means receiving a signal applied from a preceding stage and holding the same, and second holding means for holding a signal applied from said first holding means and supplying the same to a succeeding stage, said first holding means including, a first latch circuit, first switch means responsive to a first clock signal for supplying the signal applied from the preceding stage to said first latch circuit, and second switch means responsive to a prescribed control signal for supplying a corresponding parallel signal to said first latch circuit, said second holding means including, a second latch circuit, and third switch means responsive to a second clock signal for supplying the signal applied from said first holding means to said second latch circuit, and said second latch circuit including, first inversion means of a tri-state type for receiving the signal from said third switch means, and second inversion means connected in antiparallel to said first inversion means and having a smaller driving capability than said first inversion means, said first inversion means attaining a high impedance state in response to said control signal.

2. A parallel/serial conversion circuit as recited in claim 1, wherein said first latch circuit includes, third inversion means for receiving the signal from said first and second switch means, and fourth inversion means connected in antiparallel to said third inversion means, and said third inversion means has a larger driving capability than said fourth inversion means.

3. A parallel/serial conversion circuit as recited in claim 2, wherein said control signal includes first and second control signals complementary to each other, said second switch means includes an NMOS transistor connected between a corresponding parallel signal and said first latch circuit and having a gate receiving said first control signal, and a PMOS transistor connected between said corresponding parallel signal and said first latch circuit and having a gate receiving said second control signal, said first inversion means includes, an input node receiving the signal from said third switch means, an output node connected to the first switch means of the succeeding stage, first and second PMOS transistors connected in serial between a first power supply potential and said output node, and first and second NMOS transistors connected in serial between a second power supply potential and said output node, said first PMOS transistor having a gate receiving said first control signal, said second PMOS transistor having a gate connected to said input node, said first NMOS transistor having a gate receiving said second control signal, said second NMOS transistor having a gate connected to said input node.

4. A serial/parallel conversion circuit for converting a serial signal into a plurality of parallel signals, comprising a plurality of register means provided correspondingly to said plurality of parallel signals and connected in serial, wherein each of said plurality of register means includes first holding means receiving a signal applied from a preceding stage and holding the same, second holding means for holding a signal applied from said first holding means and applying the same to a succeeding stage, and third holding means for holding a signal applied from said first holding means and supplying the same as a parallel signal, said first holding means including, a first latch circuit, and a first switch means responsive to a first clock signal for supplying the signal applied from the preceding stage to said first latch circuit, said second holding means including, a second latch circuit, and second switch means responsive to a second clock signal for supplying the signal applied from said first holding means to the second latch circuit, said third holding means including, a third latch, and third switch means responsive to a prescribed control signal for supplying the signal applied from said first holding means as a parallel signal to said third latch circuit, said second latch circuit including, first inversion means receiving the signal from said second switch means, and second inversion means of a tri-state type connected to said first inversion means in antiparallel and having a smaller driving capability than said first inversion means, and said second inversion means attaining a high impedance state in response to said control signal.

5. A serial/parallel conversion circuit as recited in claim 4, wherein said first latch circuit includes, third inversion means receiving the signal from said first switch means, and fourth inversion means connected to said third inversion means in antiparallel, said third inversion means having a larger driving capability than said fourth inversion means, and said third latch circuit includes, fifth inversion means receiving the signal from said third switching means, and sixth inversion means connected to said fifth inversion means in antiparallel, said fifth inversion means having a larger driving capability than said sixth inversion means.

6. A serial/parallel conversion circuit as recited in claim 5, wherein
said control signal includes first and second control signals complementary to each other,
said third switch means includes,
an NMOS transistor connected between said first latch circuit and said third latch circuit and having a gate receiving said first control signal, and
a PMOS transistor connected between said first latch circuit and said third latch circuit and having a gate receiving said second control signal, and
said second inversion means includes,
an input node connected to said first inversion means,
an output node connected to said second switch means,
first and second PMOS transistors connected in serial between a first power supply potential and said output node, and
first and second NMOS transistors connected in serial between a second power supply potential and said output node,
said first PMOS transistor having a gate receiving said first control signal,
said second PMOS transistor having a gate connected to said input node,
said first NMOS transistor having a gate receiving said second control signal,
said second NMOS transistor having a gate connected to said input node.

7. A system, comprising:
clock signal generation means responsive to a reference clock signal for generating first and second clock signals;
control signal generation means responsive to a frame pluse for generating a control signal;
a serial/parallel conversion circuit for converting a serial signal into a plurality of parallel signals;
circuit means for receiving said plurality of parallel signals converted by said serial/parallel conversion means and outputting a plurality of parallel signals; and
a parallel/serial conversion means for converting said plurality of parallel signals output from said circuit means into a serial signal, wherein
said serial/parallel conversion means includes a plurality of register means provided correspondingly to said plurality of parallel signals and connected in serial,
each of said plurality of register means including first holding means receiving a signal applied from a preceding stage and holding the same, second holding means for holding a signal applied from said first holding means and applying the same to a succeeding stage, and third holding means for holding a signal applied from said first holding means and supplying the same as a parallel signal,
said first holding means including,
a first latch circuit, and
first switch means responsive to said first clock signal for supplying the signal applied from the preceding stage to said first latch circuit,
said second holding means including,
a second latch circuit, and
second switch means responsive to said second clock signal for supplying the signal applied from said first holding means to said second latch circuit,
said third holding means including,
a third latch circuit,
and third switch means responsive to said control signal for supplying the signal applied from said first holding means as a parallel signal to said third latch circuit,
said second latch circuit including,
first inversion means receiving the signal from said second switch means, and
second inversion means of a tri-state type connected in antiparallel to said first inversion means, having a smaller driving capability than said first inversion means and attaining a high impedance state in response to said control signal,
said parallel/serial conversion means includes a plurality of register means provided correspondingly to said plurality of parallel signals and connected in serial,
each of said plurality of register means including fourth holding means receiving a signal applied from the preceding stage and holding the same and fifth holding means for holding a signal applied from the fourth holding means and supplying the same to a succeeding stage,
said fourth holding means including,
a fourth latch circuit,
fourth switch means responsive to said first clock signal for supplying the signal applied from the preceding stage to said fourth latch circuit, and
fifth switch means responsive to said control signal for supplying a corresponding parallel signal to said fourth latch circuit,
said fifth holding means including,
a fifth latch circuit, and
sixth switch means responsive to said second clock signal for supplying the signal applied from said fourth holding means to said fifth latch circuit, and
said fifth latch circuit including,
third inversion means of a tri-state type receiving the signal from said sixth switch means and attaining a high impedance state in response to said control signal, and
fourth inversion means connected in antiparallel to said third inversion means and having a smaller driving capability than said third inversion means.

8. A method of operating a parallel/serial conversion circuit including a plurality of register means provided correspondingly to a plurality of parallel signals and connected in series, each of said plurality of register means including first holding means receiving a signal applied from a preceding stage and holding the same and second holding means for holding a signal applied from said first holding means and supplying the same to a succeeding stage, said first holding means including a first latch circuit, first switch means for supplying the signal applied from the preceding stage to said first latch circuit, and second switch means for supplying a corresponding parallel signal to said first latch circuit, said second holding means including a second latch circuit, and third switch means for supplying the signal applied from said first holding means to said second latch circuit, said second latch circuit including first inversion means receiving the signal from said third switch means and second inversion means connected in antiparallel to said first inversion means and having a smaller driving capability than said first inversion means,
the method, comprising the steps of:

turning on said second switch means in each first holding means, in response to a prescribed control signal and bringing said first inversion means in each second holding means to a high impedance state, turning on said third switch means in each second holding means, in response to a first clock signal, and turning on said first switch means in each first holding means, in response to a second clock signal.

9. A method of operating a serial/parallel conversion circuit including a plurality of register means provided correspondingly to a plurality of parallel signals and connected in series, each of said plurality of register means including first holding means receiving a signal applied from a preceding stage and holding the same, second holding means for holding a signal applied from said first holding means and applying the same to a succeeding stage, and third holding means for holding a signal applied from said first holding means and supplying the same as a parallel signal, said first holding means including a first latch circuit and first switch means for supplying the signal supplied from the preceding stage to said first latch circuit, said second holding means including a second latch circuit and second switch means for supplying the signal applied from said first holding means to said second latch circuit, said third holding means including a third latch circuit and third switch means for supplying the signal applied from said first holding means as a parallel signal to said third latch circuit, said second latch circuit including first inversion means receiving the signal from said second switch means and second inversion means connected in anti-parallel to said first inversion means and having a smaller driving capability than said first inversion means, the method comprising the steps of:

turning on said first switch means in each first holding means, in response to a first clock signal;

turning on said second switch means in each second holding means, in response to a second clock signal; and turning on said third switch means in each third holding means in response to a prescribed control signal and bringing said second inversion means in each second holding means to a high impedance stage.

* * * * *